(12) United States Patent
Ting et al.

(10) Patent No.: US 11,315,931 B2
(45) Date of Patent: Apr. 26, 2022

(54) EMBEDDED TRANSISTOR

(71) Applicant: Taiwan Semiconductor Manufacturing Co., Ltd., Hsinchu (TW)

(72) Inventors: Yu-Wei Ting, Taipei (TW); Chun-Yang Tsai, Hsinchu (TW); Kuo-Ching Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 92 days.

(21) Appl. No.: 16/942,197

(22) Filed: Jul. 29, 2020

(65) Prior Publication Data

US 2020/0357802 A1    Nov. 12, 2020

Related U.S. Application Data

(60) Continuation of application No. 16/569,288, filed on Sep. 12, 2019, now Pat. No. 10,748,907, which is a
(Continued)

(51) Int. Cl.
*H01L 27/108* (2006.01)
*H01L 29/66* (2006.01)
(Continued)

(52) U.S. Cl.
CPC ...... *H01L 27/10876* (2013.01); *H01L 21/265* (2013.01); *H01L 21/31051* (2013.01);
(Continued)

(58) Field of Classification Search
None
See application file for complete search history.

(56) References Cited

U.S. PATENT DOCUMENTS 6,576,558 B1   6/2003   Lin et al.
7,994,559 B2   8/2011   Wang et al.
(Continued)

FOREIGN PATENT DOCUMENTS

CN   101022083 A   8/2007
CN   101300665 A   11/2008
(Continued)

OTHER PUBLICATIONS

Doyle, Brian et al., "Simultaneous Growth of Different Thickness Gate Oxides in Silicon CMOS Processing," Electron Device Letters, IEEE, vol. 16, Issue 7, IEEE, Jul. 1995, pp. 301-302.
(Continued)

*Primary Examiner* — Raj R Gupta
(74) *Attorney, Agent, or Firm* — Slater Matsil, LLP

(57) ABSTRACT

An embedded transistor for an electrical device, such as a DRAM memory cell, and a method of manufacture thereof is provided. A trench is formed in a substrate and a gate dielectric and a gate electrode formed in the trench of the substrate. Source/drain regions are formed in the substrate on opposing sides of the trench. In an embodiment, one of the source/drain regions is coupled to a storage node and the other source/drain region is coupled to a bit line. In this embodiment, the gate electrode may be coupled to a word line to form a DRAM memory cell. A dielectric growth modifier may be implanted into sidewalls of the trench in order to tune the thickness of the gate dielectric.

20 Claims, 15 Drawing Sheets

Related U.S. Application Data division of application No. 15/495,652, filed on Apr. 24, 2017, now Pat. No. 10,700,070, which is a division of application No. 14/465,578, filed on Aug. 21, 2014, now Pat. No. 9,634,134, which is a continuation-in-part of application No. 13/273,012, filed on Oct. 13, 2011, now Pat. No. 8,853,021.

(51) Int. Cl.

| | | |
|---|---|---|
| *H01L 29/78* | (2006.01) | |
| *H01L 21/265* | (2006.01) | |
| *H01L 21/3105* | (2006.01) | |
| *H01L 21/768* | (2006.01) | |
| *H01L 21/8234* | (2006.01) | |
| *H01L 29/423* | (2006.01) | |
| *H01L 21/762* | (2006.01) | |
| *H01L 29/06* | (2006.01) | |

(52) U.S. Cl.
CPC .. *H01L 21/31053* (2013.01); *H01L 21/76224* (2013.01); *H01L 21/76895* (2013.01); *H01L 21/823437* (2013.01); *H01L 21/823487* (2013.01); *H01L 27/10814* (2013.01); *H01L 27/10823* (2013.01); *H01L 29/0649* (2013.01); *H01L 29/4236* (2013.01); *H01L 29/42368* (2013.01); *H01L 29/66621* (2013.01); *H01L 29/66666* (2013.01); *H01L 29/78* (2013.01); *H01L 29/7827* (2013.01)

(56) References Cited

U.S. PATENT DOCUMENTS

| | | | |
|---|---|---|---|
| 8,686,494 B2 | 4/2014 | Mouli | |
| 8,853,021 B2 | 10/2014 | Ting et al. | |
| 9,634,134 B2 | 4/2017 | Ting et al. | |
| 2002/0094622 A1 | 7/2002 | Sneelal et al. | |
| 2002/0182826 A1* | 12/2002 | Cheng | H01L 21/76237 |
| | | | 438/433 |
| 2005/0164442 A1 | 7/2005 | Kanamitsu et al. | |
| 2006/0017132 A1* | 1/2006 | Birner | H01L 21/02321 |
| | | | 257/510 |
| 2006/0060259 A1 | 3/2006 | Devitt | |
| 2007/0007571 A1 | 1/2007 | Lindsay et al. | |
| 2007/0015333 A1 | 1/2007 | Kishimoto et al. | |
| 2007/0057301 A1 | 3/2007 | Wang et al. | |
| 2008/0029810 A1 | 2/2008 | Kim et al. | |
| 2008/0079070 A1 | 4/2008 | Seo et al. | |
| 2008/0293213 A1* | 11/2008 | Yang | H01L 21/76235 |
| | | | 438/433 |
| 2008/0305644 A1 | 12/2008 | Noda et al. | |
| 2009/0072289 A1 | 3/2009 | Kim et al. | |
| 2009/0114968 A1 | 5/2009 | Wang et al. | |
| 2010/0320461 A1 | 12/2010 | Su et al. | |
| 2011/0175171 A1 | 7/2011 | Nam | |
| 2012/0049255 A1 | 3/2012 | Ryu | |
| 2012/0164812 A1* | 6/2012 | Ryu | H01L 27/10876 |
| | | | 438/381 |
| 2013/0092989 A1 | 4/2013 | Ting et al. | |
| 2014/0361354 A1 | 12/2014 | Ting et al. | |
| 2015/0021677 A1 | 1/2015 | Ting et al. | |
| 2017/0229467 A1 | 8/2017 | Ting et al. | |
| 2020/0006349 A1 | 1/2020 | Ting et al. | |

FOREIGN PATENT DOCUMENTS

| | | |
|---|---|---|
| CN | 101640182 A | 2/2010 |
| DE | 102006016327 A1 | 12/2006 |
| DE | 102008027193 A1 | 12/2008 |
| DE | 102004031453 B4 | 1/2009 |
| KR | 19990069332 A | 9/1999 |
| KR | 100518506 B1 | 9/2005 |
| KR | 20090025745 A | 3/2009 |
| KR | 20090096996 A | 9/2009 |
| KR | 20100074503 A | 7/2010 |
| KR | 1020110014899 A | 2/2011 |
| TW | 200921913 A | 5/2009 |

OTHER PUBLICATIONS

Sharma, Satinder K. et al., "Multiple thickness gate oxides with fluorine implantation for system on chip applications," Vacuum, Jul. 14, 2009, vol. 83, Issue 11, 2009 Elsevier Ltd., pp. 1359-1363.

Weber, A. et al., "Retention Tail Improvement for Gbit DRAMs through Trap Passivation confirmed by Activation Energy Analysis," 2006 Proceeding of the 36th European Solid-State Device Research Conference, IEEE, Sep. 2006, pp. 250-253.

Woerlee, P. H. et al., "Multiple Gate Oxide Technology Using Fluorine Implantation," 2001 Proceeding of the 31st European Solid-State Device Reseach Conference, Sep. 11-13, 2001, IEEE, pp. 107-110.

* cited by examiner

EMBEDDED TRANSISTOR

This application is a continuation of U.S. patent application Ser. No. 16/569,288, entitled "Embedded Transistor," filed on Sep. 12, 2019, which is a divisional of U.S. patent application Ser. No. 15/495,652, entitled "Embedded Transistor," filed on Apr. 24, 2017, now U.S. Pat. No. 10,700,070 issued on Jun. 30, 2020, which is a divisional of U.S. patent application Ser. No. 14/465,578, entitled "Embedded Transistor," filed on Aug. 21, 2014, now U.S. Pat. No. 9,634,134, issued on Apr. 25, 2017, which is a continuation-in-part of U.S. patent application Ser. No. 13/273,012, entitled "Embedded Transistor," filed on Oct. 13, 2011, now U.S. Pat. No. 8,853,021, issued on Oct. 7, 2014, which applications are hereby incorporated herein by reference.

BACKGROUND

Generally, complementary metal oxide-semiconductor (CMOS) transistors include a gate electrode and a gate dielectric, which are formed on a substrate (usually a silicon semiconductor substrate). Lightly doped drains are formed on opposing sides of the gate electrode by implanting N-type or P-type impurities into the substrate. An oxide liner and one or more implant masks (commonly referred to as spacers) are formed adjacent the gate electrode, and additional implants are performed to complete the source/drain regions. Current flowing through the source/drain regions may then be controlled by controlling the voltage levels applied to the gate electrode.

Reduction in the size of CMOS transistors has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments of the present disclosure, like reference numbers are used to designate like elements.

Figure 1:
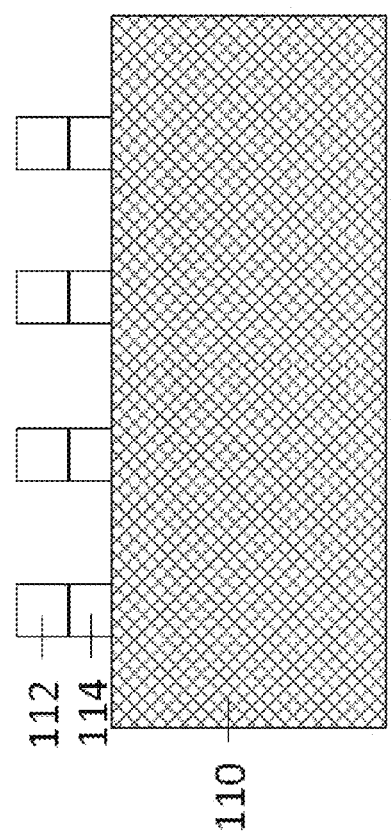
FIGS. 1-8 illustrate various intermediate stages in the manufacturing of an embedded transistor in accordance with an embodiment.

Referring first to FIG. 1, a substrate 110 is provided with a first patterned mask 112 formed thereon. The substrate 110 may comprise any semiconductor material and may comprise known structures including a graded layer or a buried oxide, for example. In an embodiment, the substrate 110 comprises bulk silicon that may be undoped or doped (e.g., p-type, n-type, or a combination thereof). Other materials that are suitable for semiconductor device formation may be used. In an embodiment, however, the substrate 110 is bulk silicon.

The first patterned mask 112 is formed to pattern the underlying materials, such as the underlying substrate 110. In an embodiment, the first patterned mask 112 comprises a photoresist material that has been masked, exposed, and developed. Generally, the photoresist material is deposited, irradiated (exposed) and developed to remove a portion of the photoresist material, thereby defining a pattern as illustrated in FIG. 1. The remaining photoresist material protects the underlying material from subsequent processing steps, such as etching.

Also shown in FIG. 1 is an optional hard mask 114. The hard mask 114 is a protective layer to prevent the underlying structures, such as the substrate 110, from being removed during an etching process. In some situations, a mask in addition to the first patterned mask 112 is desirable due to the materials to be patterned, the duration of the etch process, the types of etchants used, and the like. In an embodiment in which the substrate 110 is a silicon substrate, one such suitable hard mask 114 comprises an oxide layer, such as a silicon oxide layer, and an overlying nitride layer, such as a silicon nitride ($Si_3N_4$) layer. The oxide layer may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. The oxide layer may also be formed, for example, by an in-situ steam generation (ISSG) process in an ambient environment of $O_2$, $H_2O$, NO, or a combination thereof, or the like. In an embodiment, the oxide layer is about 50 Å to about 100 Å in thickness. The nitride layer may be formed using CVD techniques using silane and ammonia as precursor gases. The nitride layer may be patterned using $CHF_3$ plasma, and the oxide layer may be patterned using $CF_4$ plasma.

One of ordinary skill in the art will appreciate that other mask materials and/or structures may be used to form either or both of the first patterned mask 112 and the hard mask 114. For example, other materials, a single layer, three or more layers, or the like may be used. In an alternative embodiment, the hard mask may comprise a single silicon nitride layer without an underlying oxide layer.

Figure 2:
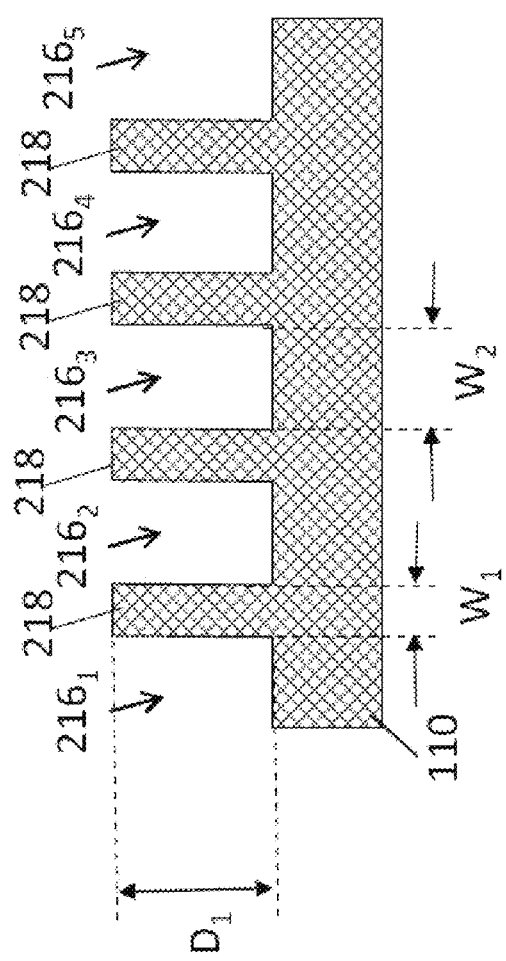

FIG. 2 illustrates the substrate 110 after the substrate has been patterned in accordance with an embodiment. The substrate 110 may be patterned by performing one or more etching steps, thereby forming trenches $216_1$-$216_5$ (collectively referred to as trenches 216) having fins 218 interposed between adjacent ones of the trenches 216. The substrate 110 may be etched by, for example, $HBr/O_2$, $HBr/Cl_2/O_2$, or $SF_6/Cl_2$ plasma. As will be discussed in greater detail below, the fins 218 will form source/drain regions of a transistor, while alternating ones of the trenches will form the gate electrodes of the transistor. Other ones of the trenches will form an isolation structure, e.g., shallow trench isolations (STIs).

In the embodiment illustrated in FIG. 2, the trenches 216 may have a depth $D_1$ (and hence the height of the fins 218) of about 1,000 Å to about 4,000 Å, and the fins 218 may have a width $W_1$ of about 100 Å to about 800 Å. While the width $W_1$ of the fins 218 are illustrated in this embodiment are the same, other embodiments may utilize fins 218 of varying widths. As noted above, subsequent processing forms source/drain regions in the upper portions of the fins 218. Thus, the size (e.g., the width and height of the fins 218) may be adjusted to achieve the desired electrical characteristics of the transistor. Moreover, it should be noted that the fins on the same wafer may have different widths and depths.

Additionally, a width $W_2$ of the trenches may also vary. As noted above, the trenches will become the gate electrodes and isolation trenches. As such, the width of the trenches may be adjusted to vary the gate length and the isolation characteristics. For example, it may be desirable in some embodiments to provide wider isolation trenches as compared to the trenches for the gate electrode to provide greater isolation characteristics between adjacent devices. In other embodiments, a wider trench for the gate electrode may be desirable.

Also illustrated in FIG. 2 is the removal of the first patterned mask 112 (see FIG. 1). The first patterned mask 112 may be removed, for example, by an $O_2$ plasma dry strip and a mixture of concentrated sulphuric acid and hydrogen peroxide.

Figure 3:
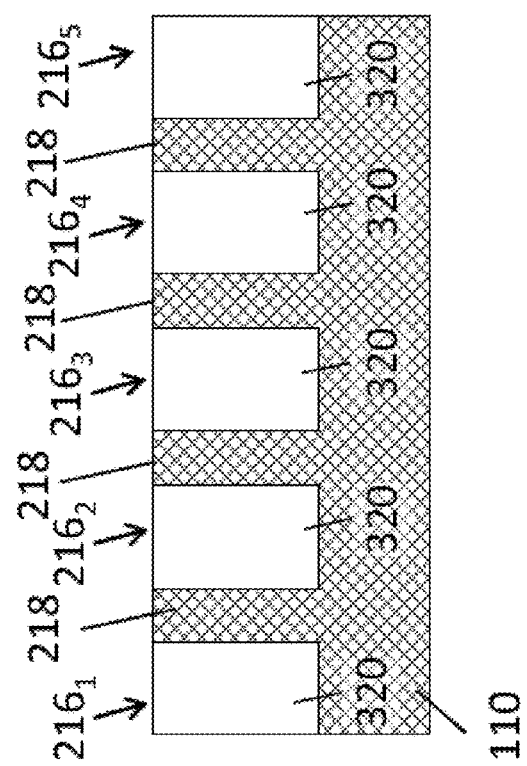

Referring now to FIG. 3, a first dielectric material 320 is formed over the substrate 110, substantially filling the trenches 216. In an embodiment, the first dielectric material 320 comprises a silicon oxide layer that may be formed by a high-density plasma CVD deposition process using $SiH_4$ and $O_2$ mixture.

As illustrated in FIG. 3, the first dielectric material 320 is planarized to a top surface of the substrate 110 in accordance with an embodiment. The first dielectric material 320 may be planarized, for example, by using a chemical-mechanical polishing (CMP) process using an oxide slurry wherein the substrate 110 acts as a stop layer.

Figure 4:
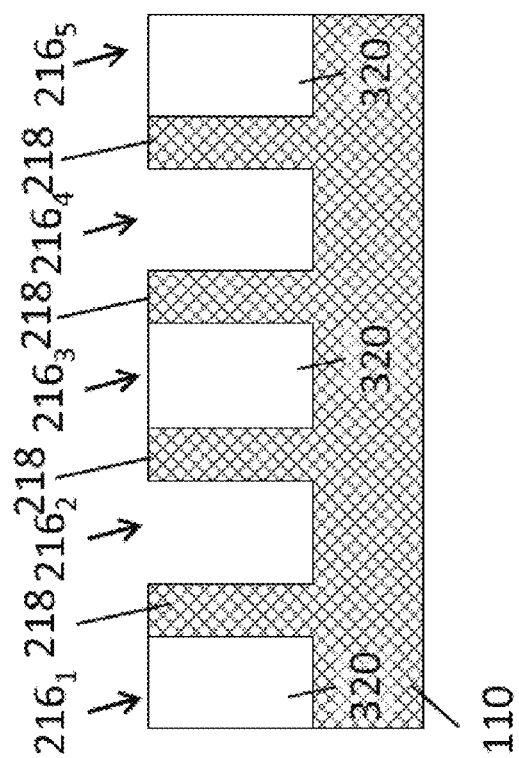

FIG. 4 illustrates removal of the first dielectric material 320 from select ones of the trenches 216, such as trenches $216_2$ and $216_4$. In an embodiment, the first dielectric material 320 may be selectively removed from trenches $216_2$ and $216_4$ by forming and patterning a mask layer (not shown) to protect the first dielectric material 320 in trenches $216_1$, $216_3$, and $216_5$ while leaving the dielectric material in trenches $216_2$ and $216_4$ exposed. The mask may be patterned using photolithography techniques similar to those discussed above with reference to etching the substrate 110 as illustrated in FIGS. 1 and 2. For example, a photoresist material may be formed, exposed according to a desired pattern (e.g., exposing trenches $216_2$ and $216_4$), and developed. Additionally, a hard mask such as that discussed above may also be used.

In an embodiment in which the first dielectric material 320 is a silicon oxide and the substrate 110 is silicon, the first dielectric material 320 may be removed using an anisotropic dry etch process using an etchant having a high etch selectivity between the substrate 110 and the first dielectric material 320, such as $CF_4$ or $C_2F_6$. In this manner, substrate 110 is relatively unaffected while etching or removing the first dielectric material 320.

Figure 5:
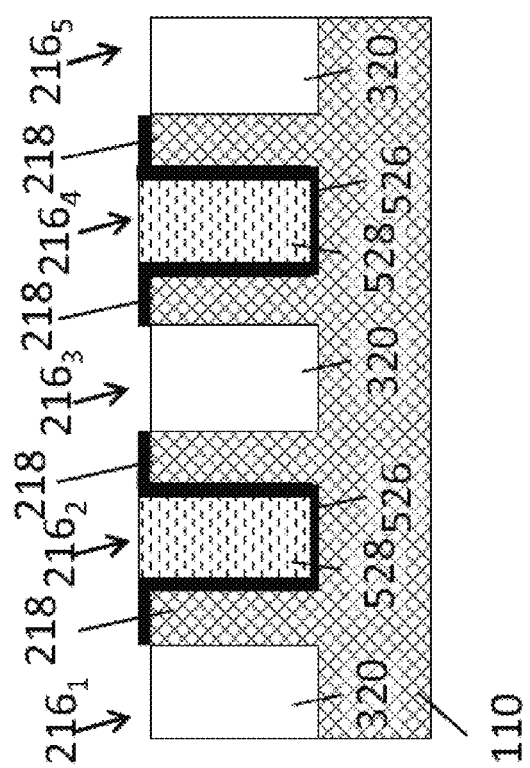

FIG. 5 illustrates the substrate 110 after a gate insulator layer 526 is formed along the surfaces of the trenches $216_2$ and $216_4$ and a gate electrode material 528 is formed within the trenches $216_2$ and $216_4$, in accordance with an embodiment. Generally, the gate insulator layer 526 prevents electron depletion between the source/drain regions and the gate electrode. In an embodiment, the gate insulator layer 526 comprises an oxide layer formed by an oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor. Other materials including, high k dielectric materials, such as $HfO_2$, $HfSiO_2$, ZnO, $ZrO_2$, $Ta_2O_5$, $Al_2O_3$ and the like, and other processes, such as Atomic Layer Deposition (ALD), Atomic Vapor Deposition (AVD), and the like, may also be used. In an embodiment, the gate insulator layer 526 has a thickness between about 20 Å and about 50 Å. It should be noted that FIG. 5 illustrates that the gate insulator layer 526 does not extend over the first dielectric material 320 for illustrative purposes only. Whether the gate insulator layer 526 extends over the first dielectric material 320 is dependent upon, at least in part, the method used to form the gate insulator layer 526. For example, a thermal process generally results in an embodiment similar to that illustrated in FIG. 5, while the gate insulator layer 526 may extend over the first dielectric material 320 when the gate insulator layer 526 is formed using, e.g., a CVD process or an ISSG process.

Optionally, an implant may be performed to aid or retard the formation of the gate insulator layer 526. For example, a nitrogen implant may be performed to retard an oxide growth in select areas, such as the bottom of the trench, and a fluorine implant may be performed to increase the oxide growth. In an embodiment, a nitrogen implant may be performed at an angle normal to the upper surface of the substrate. In this embodiment, sidewalls of the trenches will be implanted less than the bottom surface of the trench. The nitrogen implant along the bottom of the trench retards the oxide growth, thereby resulting in a thinner gate insulator layer along the bottom of the trenches as compared to the sidewalls of the trench. In another embodiment, the implant angle may be adjusted to implant nitrogen along the sidewalls, thereby resulting in a thicker gate insulator along the bottom as compared to the sidewalls. Similar effects, e.g., relatively thinner or thicker gate insulator layer along the bottom of the trenches, may be obtained using a fluorine implant to increase the relative growth rate of the gate insulator layer.

It should be noted that the substrate 110 may be doped before forming the gate insulator layer to prepare, for example, the channel region. For example, in forming a p-type transistor having p-type doped source/drain regions, an n-type dopant, such as phosphorous, arsenic, nitrogen, antimony, or the like, may be implanted into the channel region (along the sidewalls and bottom of the trenches $216_2$ and $216_4$) of the substrate 110 prior to forming the gate insulator layer 526. Similarly, in forming an n-type transistor having n-type doped source/drain regions, a p-type dopant, such as boron, aluminum, gallium, indium, or the like, may be implanted into the channel region of the substrate. The implant angle may be adjusted to ensure proper implantation along the sidewall regions of the trenches $216_2$ and $216_4$ as well as the bottom of the trenches $216_2$ and $216_4$. Alternatively, the substrate 110 may be doped prior to forming the trenches by forming an n-well or a p-well, respectively, in which the trenches $216_2$ and $216_4$ are formed.

For example, a p-type transistor may be formed by implanting phosphorous ions at an angle of about 0° to about 5° relative to the bottom surface of the trenches $216_2$ and $216_4$ and at an angle between about −25° to about 25° relative to of a vertical sidewall of the trenches $216_2$ and $216_4$ at a dose of about 1E12 to about 3E13 atoms/cm$^2$ and at an energy of about 20 to about 400 KeV. An n-type transistor may be formed by implanting boron ions at an angle of about 0° to about 5° relative to the bottom surface of the trenches $216_2$ and $216_4$ and at an angle between about −25° to about 25° relative to a vertical sidewall of the trenches $216_2$ and $216_4$ at a dose of about 1E12 to about 3E13 atoms/cm$^2$ and at an energy of about 5 to about 300 KeV.

The gate electrode material 528 comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment, the gate electrode layer is formed by depositing, e.g., CVD, low-pressure CVD (LPCVD), and the like, a conformal layer covering the substrate 110 and filling the trenches $216_2$ and $216_4$. Thereafter, a planarizing process, such as a CMP process, may be performed to remove excess material, thereby forming a structure similar to that illustrated in FIG. 5.

The gate electrode material 528 may be deposited doped or undoped. For example, in an embodiment the gate electrode material 528 may be formed by depositing a polysilicon layer and, once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode material 528 may comprise a polysilicon metal alloy or a metal gate comprising metals such as tungsten, nickel, titanium, and titanium nitride, and the like, for example.

Figure 6:
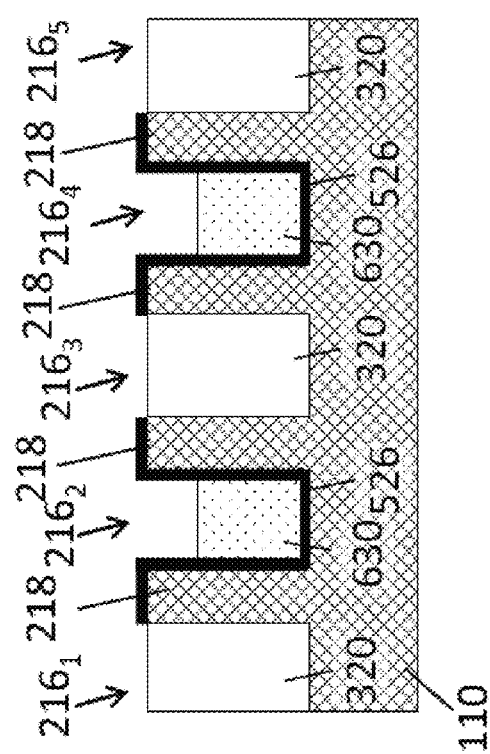

FIG. 6 illustrates recessing of the gate electrode material 528 (see FIG. 5) to form the gate electrodes 630 along the bottom portions of the trenches $216_2$ and $216_4$. In embodiments in which the gate electrode material 528 comprises polysilicon, the recessing may be performed using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH$:$H_2O_2$:$H_2O$ (APM), $NH_2OH$, KOH, $HNO_3$:$NH_4F$:$H_2O$, and/or the like. In an embodiment, the gate electrode material 528 is recessed from about 500 Å to about 2,000 Å.

Figure 7:
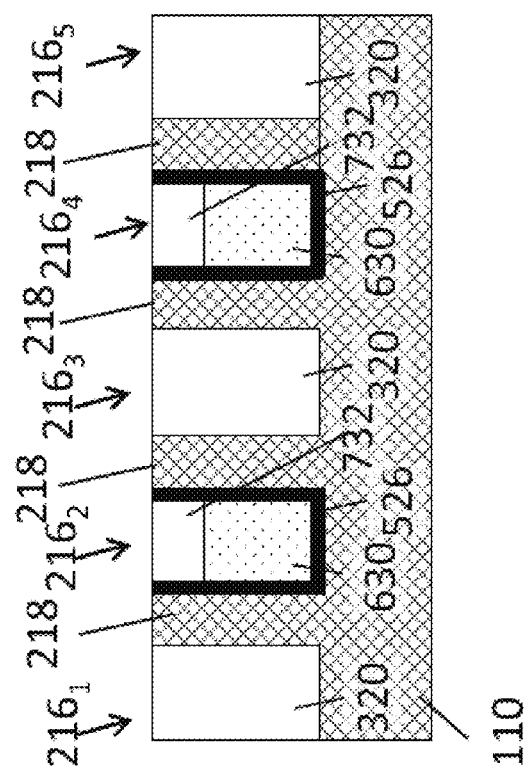

Referring now to FIG. 7, a second dielectric layer 732 is formed over the substrate 110, filling the recesses above the gate electrodes 630 in the trenches $216_2$ and $216_4$. The second dielectric layer 732 may be formed of similar materials using similar processes as those discussed above with reference to the first dielectric material 320. After depositing the second dielectric layer 732, a planarization process, e.g., a CMP process, may be used to remove excess material, thereby forming a structure similar to that illustrated in FIG. 7. In an embodiment, this planarization process exposes the fins 218.

Figure 8:
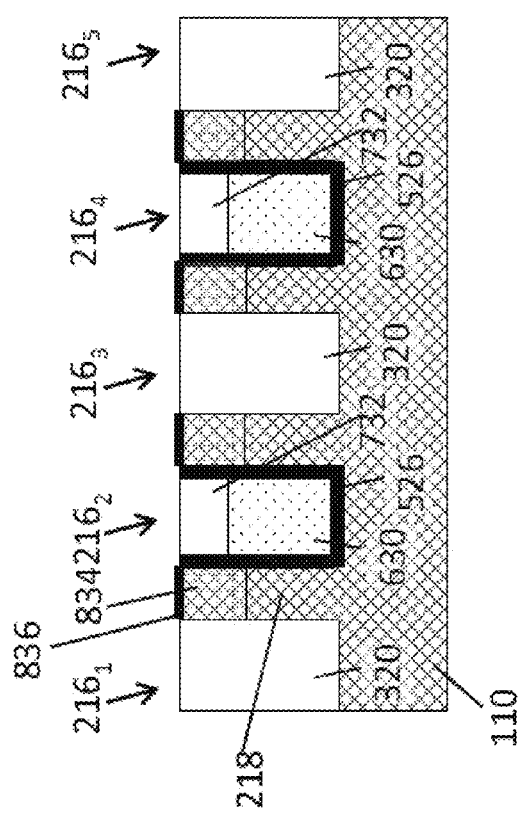

FIG. 8 illustrates formation of the source/drain regions 834 in accordance with an embodiment. The source/drain regions 834 may be doped by implanting n-type or p-type dopants. For example, n-type transistor may be formed by implanting an n-type ion such as phosphorous ions, at a dose of about 1E15 to about 5E15 atoms/cm$^2$ and at an energy of about 20 to about 100 KeV. A p-type transistor may be formed by p-type ions, such as boron ions, at a dose of about 1E15 to about 5E15 atoms/cm$^2$ and at an energy of about 10 to about 50 KeV.

Furthermore, FIG. 8 also illustrates optional silicide regions 836 in accordance with an embodiment. The silicide regions 836 reduce contact resistance between the source/drain regions 834 and contacts formed in subsequent processing steps. The silicide regions 836 may be formed, for example, by depositing a metal layer (not shown) such as titanium, nickel, tungsten, or cobalt via plasma vapor deposition (PVD) procedures. An anneal procedure causes the metal layer to react with the substrate 110, e.g., silicon, of the source/drain regions 834 to form metal silicide. Portions of the metal layer overlying other areas, such as the first dielectric material 320 (e.g., the isolation structures) and second dielectric layer 732 remain unreacted. Selective removal of the unreacted portions of the metal layer may be accomplished, for example, via wet etch procedures. An additional anneal cycle may be used if desired to alter the phase of silicide regions 836, which may result in a lower resistance.

Figure 9:
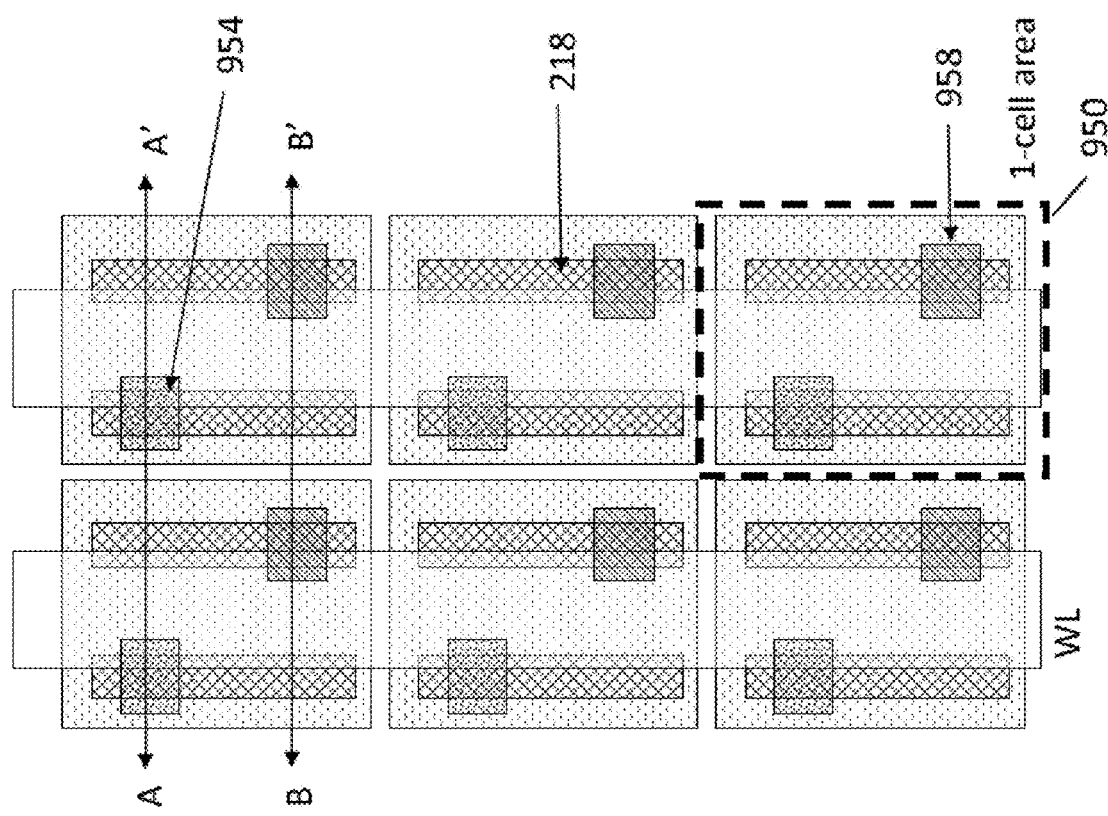
FIG. 9 illustrates a plan view of a memory cell utilizing an embedded transistor in accordance with an embodiment.
Figure 10A:
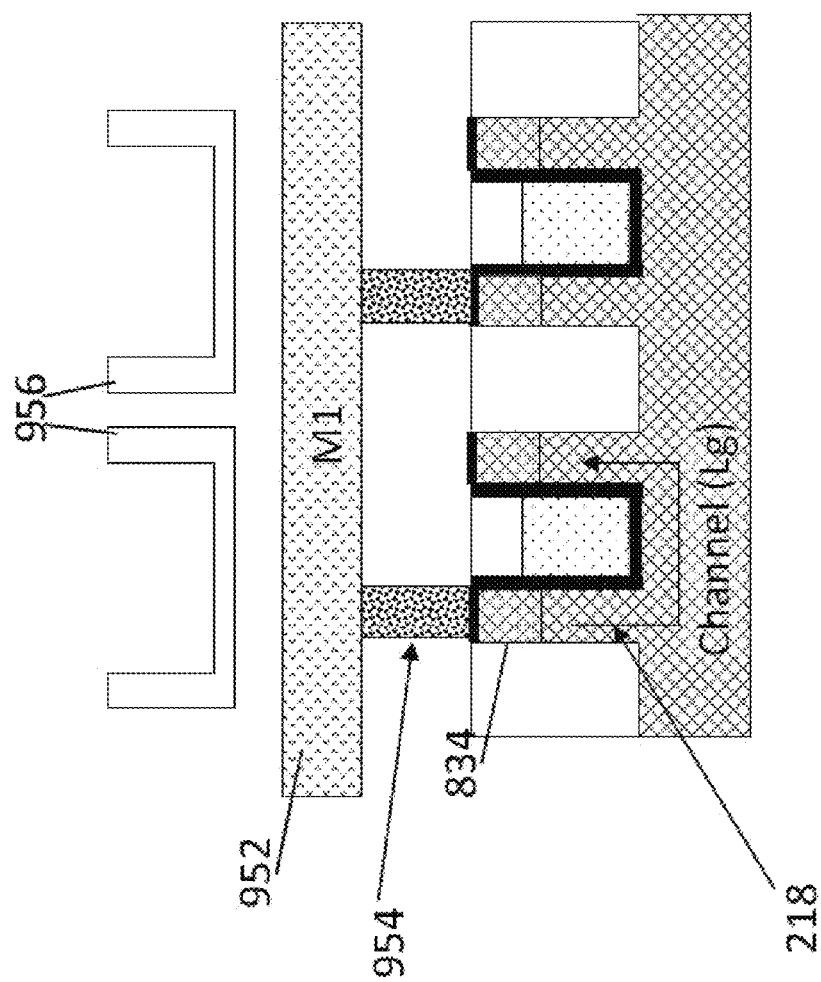
FIGS. 10A and 10B are cross-sectional views of the memory cell illustrated in FIG. 9.
Figure 10B:
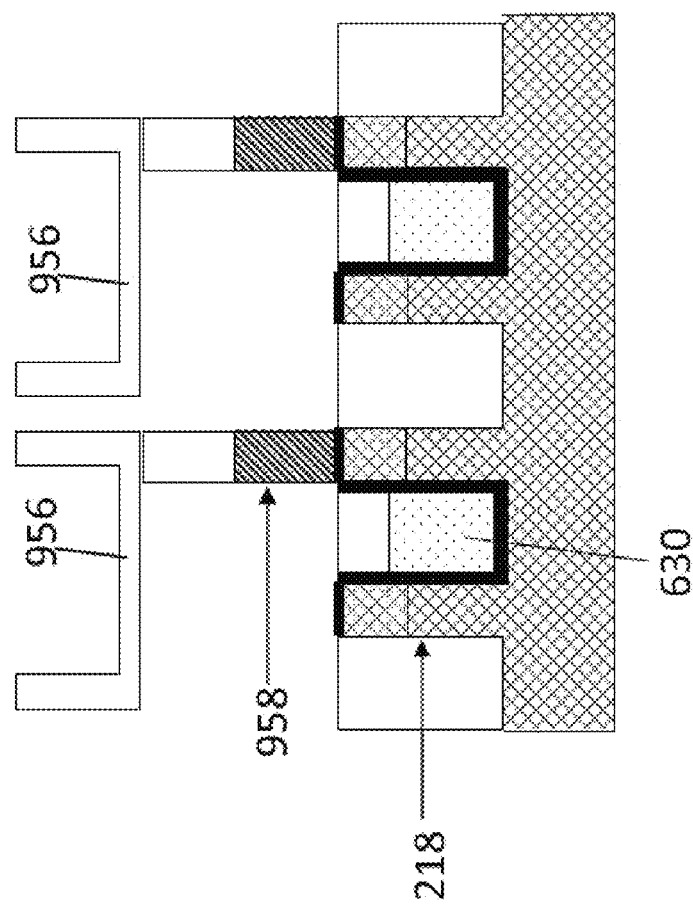

As can be appreciated, the above paragraphs describe embodiments of an embedded transistor that may be used in a variety of applications. For example, FIGS. 9, 10A, and 10B illustrate an embodiment in which the embedded transistor disclosed above is utilized as an access transistor in a DRAM memory cell. In particular, FIG. 9 illustrates a plan view of a plurality of DRAM memory cells, FIG. 10A illustrates a cross-sectional view along the A-A' line of FIG. 9, and FIG. 10B illustrates a cross-sectional view along the B-B' line of FIG. 9. A single memory cell is designated by the dashed box 950.

The memory cell 950 includes bitline 952 formed in, for example, the first metallization layer M1 having bitline contacts 954 electrically coupling the bitline 952 to one of the source/drain regions 834 of the underlying access transistor. The other of the source/drain regions 834 of the access transistor is electrically coupled to a storage node 956 via storage node contacts 958. The storage node 956 may be, for example, a metal-insulator-metal (MIM) capacitor, a planar capacitor, a U-shaped capacitor, a vertical capacitor, a horizontal capacitor, a non-capacitor storage structure, or the like. The gate electrode 630 is electrically coupled to a wordline (WL).

It should be appreciated that embodiments such as some of those discussed above utilize a single mask and etch process to form the isolation trenches and the embedded gate electrodes. In this manner, embodiments disclosed herein using a self-aligned process avoid misalignment issues that may be seen in other approaches in which the isolation trenches and the gate electrode trenches are formed with separate mask and etching processes. It is believed that these embodiments reduce wordline disturbance issues.

Embodiments disclosed herein also allow layout designers greater freedom. For example, the gate length is defined by the depth of the trench as opposed to the pitch between fins, thereby possibly allowing the gate length to be adjusted without increasing the pitch.

Figure 11:
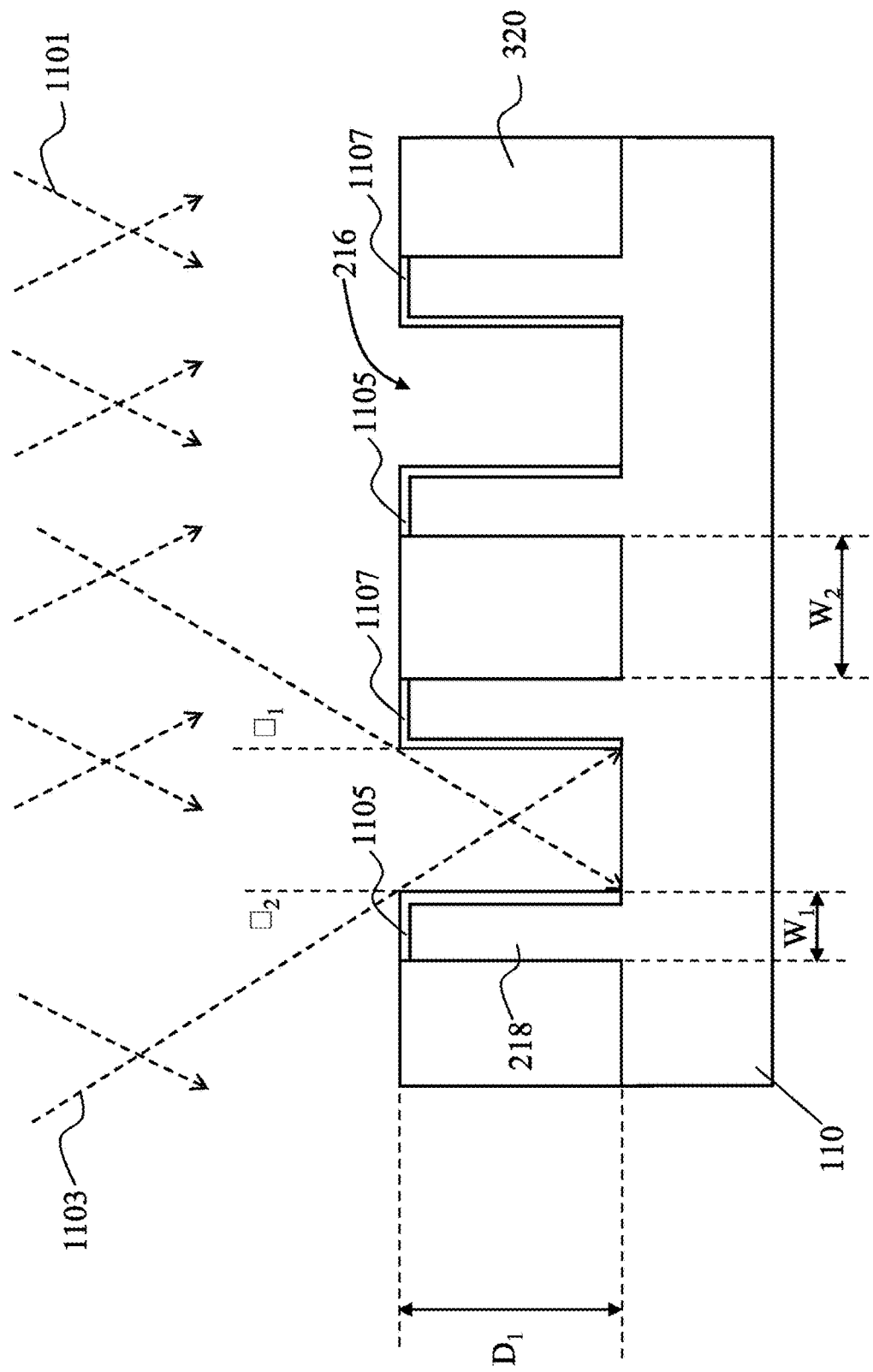
FIGS. 11-12 illustrate an embodiment which uses a double sided tilt angle implant in accordance with an embodiment.

FIG. 11 illustrates further embodiments in which the thickness of the gate insulator layer 526 (not illustrated in FIG. 11 but illustrated and discussed in this embodiment below with respect to FIG. 12) may be tuned along the sidewalls of the trenches 216. In the embodiment that is initiated in FIG. 11, the fins 218 and the trenches 216 have already been formed and some of the trenches have been filled with the first dielectric material 320 (as described above with respect to FIGS. 1-3). Once formed, a double sided tilt angle implant that comprises a first implantation process (represented in FIG. 11 by the arrows labeled 1101) and a second implantation process (represented in FIG. 11 by the arrows labeled 1103) is utilized to implant a dielectric growth modifier primarily into the sidewalls of the trenches 216. Additionally, by using a series of angled implantation processes, little to none of the dielectric growth modifier is implanted into the bottom of the trench 216. In an embodiment the dielectric growth modifier may be a dielectric growth enhancer, such as fluorine or a dielectric growth inhibitor, such as nitrogen.

In an embodiment in which the dielectric growth modifier is the dielectric growth enhancer, when the dielectric growth modifier is implanted primarily into the sidewall of the trench 216, the gate insulator layer 526 will grow faster along the sidewalls and form a thicker gate insulator layer 526 along the sidewalls of the trench 216 than along the bottom of the trench 216. Alternatively, in an embodiment in which the dielectric growth modifier is the dielectric growth inhibitor, the gate insulator layer 526 will grow slower along the sidewalls and form a thinner gate insulator layer 526 along the sidewalls of the trench 216 than along the bottom of the trench 216.

In an embodiment the first implantation process 1101 implants the dielectric growth modifier at a first angle $\Theta_1$ such that the dielectric growth modifier is primarily implanted into the sidewall of the trench and shuttering effects are avoided. For example, in an embodiment in which the fins 218 have a spacing of the width $W_2$ and the trenches 216 have the depth $D_1$, the first implantation process 1101 is performed at the first angle $\Theta_1$ that is greater than an arctangent of the width $W_2$ divided by the depth $D_1$ (e.g., $\Theta_1 > \tan^{-1}(W_2/D_1)$). By using an angle greater than the arctangent of the width $W_2$ divided by the depth $D_1$, the dielectric growth modifier will be primarily implanted into the sidewalls of the trench 216 instead of in the bottom of the trench 216.

In an embodiment in which the dielectric growth modifier is fluorine, the first implantation process 1101 may implant the fluorine and form a first dielectric growth modifier zone 1105 within the sidewall of the trench 216. In an example, the first dielectric growth modifier zone 1105 may be formed to have a concentration of the dielectric growth modifier (e.g., fluorine) of between about 1E13 $cm^2$ and about 1E15 $cm^2$, such as about 1E14 $cm^2$.

Similarly, the second implantation process 1103 may be performed in an opposite direction than the first implantation process 1101 in order to implant the dielectric growth modifier into an opposing sidewall of the trench 216 than the first implantation process 1101. In this embodiment the second implantation process 1103 may implant the fluorine at a second angle $\Theta_2$ that is opposite the first angle $\Theta_1$. The second angle $\Theta_2$ may similarly be based on the width $W_2$ and the depth $D_1$, such as by being larger than the arctangent of the width $W_2$ divided by the depth $D_1$ (e.g., $\Theta_2 > \tan^{-1}(W_2/D_1)$), although in an opposite direction than the first angle $\Theta_1$ in order to implant the dielectric growth modifier into an opposite sidewall of the trench 216 than the first implantation process 1101.

The first implantation process 1101 and the second implantation process 1103 may be performed as separate processes, with the substrate 110 repositioned between the first implantation process 1101 and the second implantation process 1103. Alternatively, the first implantation process 1101 and the second implantation process 1103 may be performed as a single process, wherein the substrate 110 is rotated during the process such that the opposing sidewalls of the trench 216 are exposed to the implantation process. Any suitable method of implanting the dielectric growth modifier may alternatively be used, and all such methods are fully intended to be included within the scope of the embodiment.

In an embodiment in which the dielectric growth modifier is fluorine, the second implantation process 1103 may implant the fluorine and form a second dielectric growth modifier zone 1107 within the sidewall of the trench 216. In an example, the second dielectric growth modifier zone 1107 may be formed to have a concentration of the dielectric growth modifier (e.g., fluorine) of between about 1E13 $cm^2$ and about 1E15 $cm^2$, such as about 1E14 $cm^2$.

Figure 12:
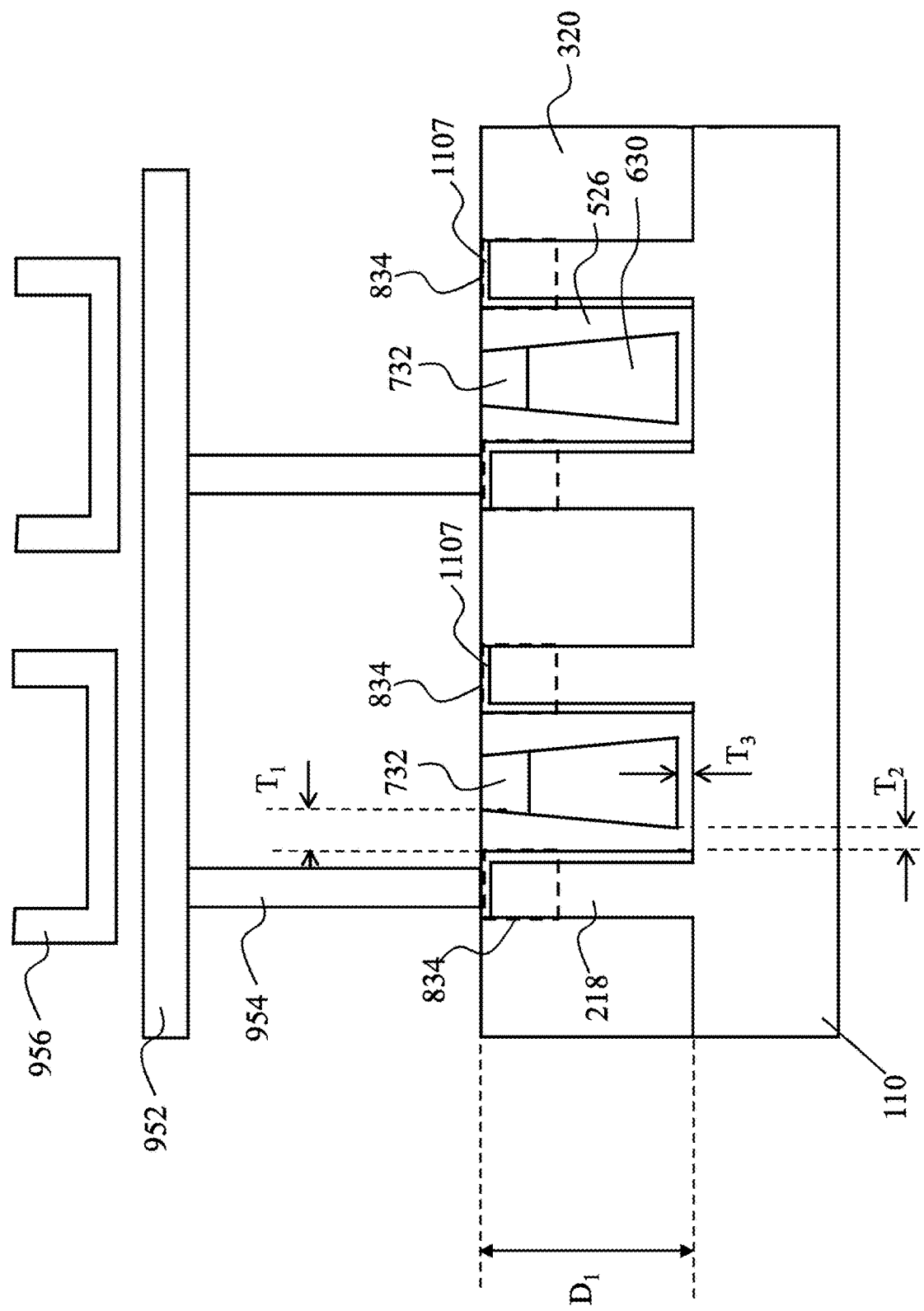

FIG. 12 illustrates that, once the first implantation process 1101 and the second implantation process 1103 have been performed to form the first dielectric growth modifier zone 1105 and the second dielectric growth modifier zone 1107, the gate insulator layer 526 may be formed as described above with respect to FIG. 5. For example, the gate insulator layer 526 may be an oxide layer formed by an oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor, although any suitable process and material may alternatively be utilized.

However, with the presence of the first dielectric growth modifier zone 1105 and the second dielectric growth modifier zone 1107 located primarily in the sidewalls of the trench 216, the gate insulator layer 526 will grow at a faster rate along the sidewalls of the trench 216 (where there is a higher concentration of fluorine) than along the bottom of the trench 216 (where there is a lower concentration of fluorine, if any at all). As such the gate insulator layer 526 will be thicker along the sidewalls of the trench 216 than along the bottom, and gradually decreases from the top of the trench 216 to the bottom of the trench 216.

For example, in an embodiment in which the dielectric growth modifier is fluorine, the gate insulator layer 526 along a sidewall of the trench 216 may have a first thickness $T_1$ at a top of the trench 216 of between about 30 Å to about 40 Å. The gate insulator layer 526 may also have a second thickness $T_2$ along the sidewall at a bottom of the trench 216 of less than about 20 Å. In other words, the gate insulator layer 526 along the sidewall will have a reduction in thickness from the top of the trench 216 to the bottom of the trench 216. The gate insulator layer 526 will also have a third thickness $T_3$ along the bottom of the trench 216 that is less than the first thickness $T_1$ and less than or equal to the second thickness $T_2$, such as by being less than about 20 Å.

Once the gate insulator layer 526 has been formed, the gate electrodes 630 may be formed over the gate insulator layer 526, the second dielectric layer 732 may be formed over the gate electrodes 630, the source/drain regions 834 may be formed in the fins 218 (represented in FIG. 15 by the dashed lines labeled 834), the optional silicide regions 836 (not separately illustrated in FIG. 14) may be formed, and the bitline contacts 954, the bitline 952, the storage node contacts 958 and the storage node 956 may be formed. In an embodiment the gate electrodes 630, the second dielectric layer 732, the source/drain regions 834, the optional silicide regions 836, the bitline contacts 954 and the storage node 956 may be formed as described above with respect to FIG. 5-10b. However, any other suitable methods and materials may alternatively be used.

By utilizing the dielectric growth modifier, the formation of the gate insulator layer 526 can be better controlled to produce desired results. For example, by increasing the thickness of the gate insulator layer 526 along the sidewalls, the gate insulator layer 526 will have a larger equivalent oxide thickness as well as being physically thicker. As such, the gate induced drain leakage (GIDL) can be reduced and no drawback on sub-threshold leakage (Isoff) since gate insulator thickness remains thinner at the bottom of trench 216. Additionally, using this process, there are no undesirable side effects on the channel mobility.

Figure 13:
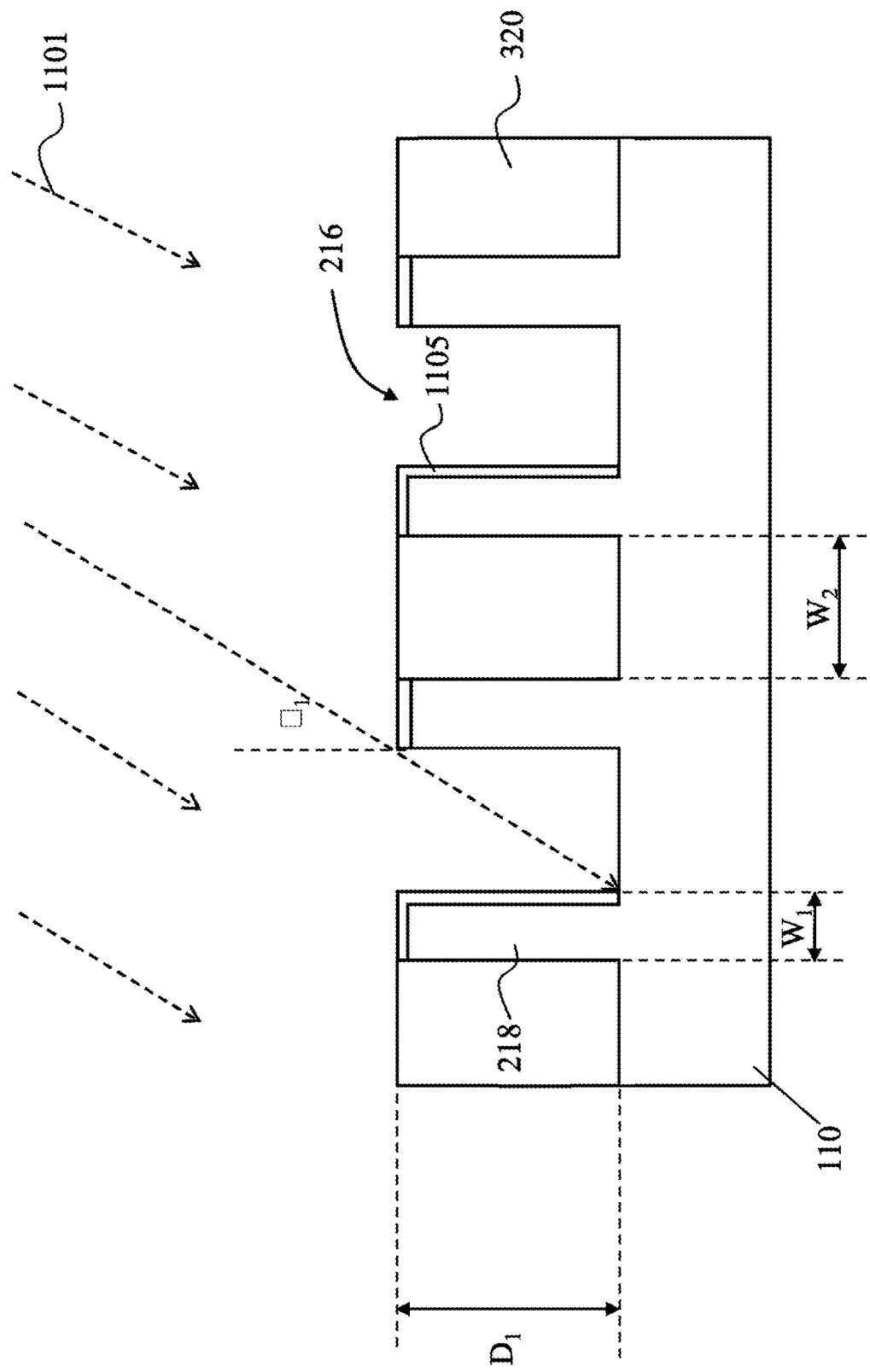
FIGS. 13-14 illustrate an embodiment which uses a single tilt angle implant in accordance with an embodiment.

FIG. 13 illustrates another embodiment in which the gate insulator layer 526 (not illustrated in FIG. 13 but illustrated and discussed below with respect to FIG. 14) is formed with a decreasing thickness along a sidewall of the trench 216. In this embodiment the first implantation process 1101 is performed as described above with respect to FIG. 11. For example, the dielectric growth modifier is implanted into a sidewall of the trench 216 to form the first dielectric growth modifier zone 1105, and the implantation is performed at the first angle $\Theta_1$, which takes into account the width $W_2$ divided by the depth $D_1$, so as to implant the dielectric growth modifier primarily into the sidewall instead of along the bottom of the trench 216.

However, in this embodiment the dielectric growth modifier is implanted into one sidewall (e.g., with the first implantation process 1101) without implanting the dielectric growth modifier into a facing sidewall. For example, in this embodiment the first implantation process 1101 may be utilized to implant the dielectric growth modifier into one sidewall of the trench 216. However, instead of following the first implantation process 1101 with the second implantation process 1103, the second implantation process 1103 is not performed, and the dielectric growth modifier is implanted into the single sidewall of the trench 216, such that the other sidewall remains primarily free from the dielectric growth modifier, forming the first dielectric growth modifier zone 1105 in a single sidewall of the trench 216 (and also along the top of the fins 218).

Figure 14:
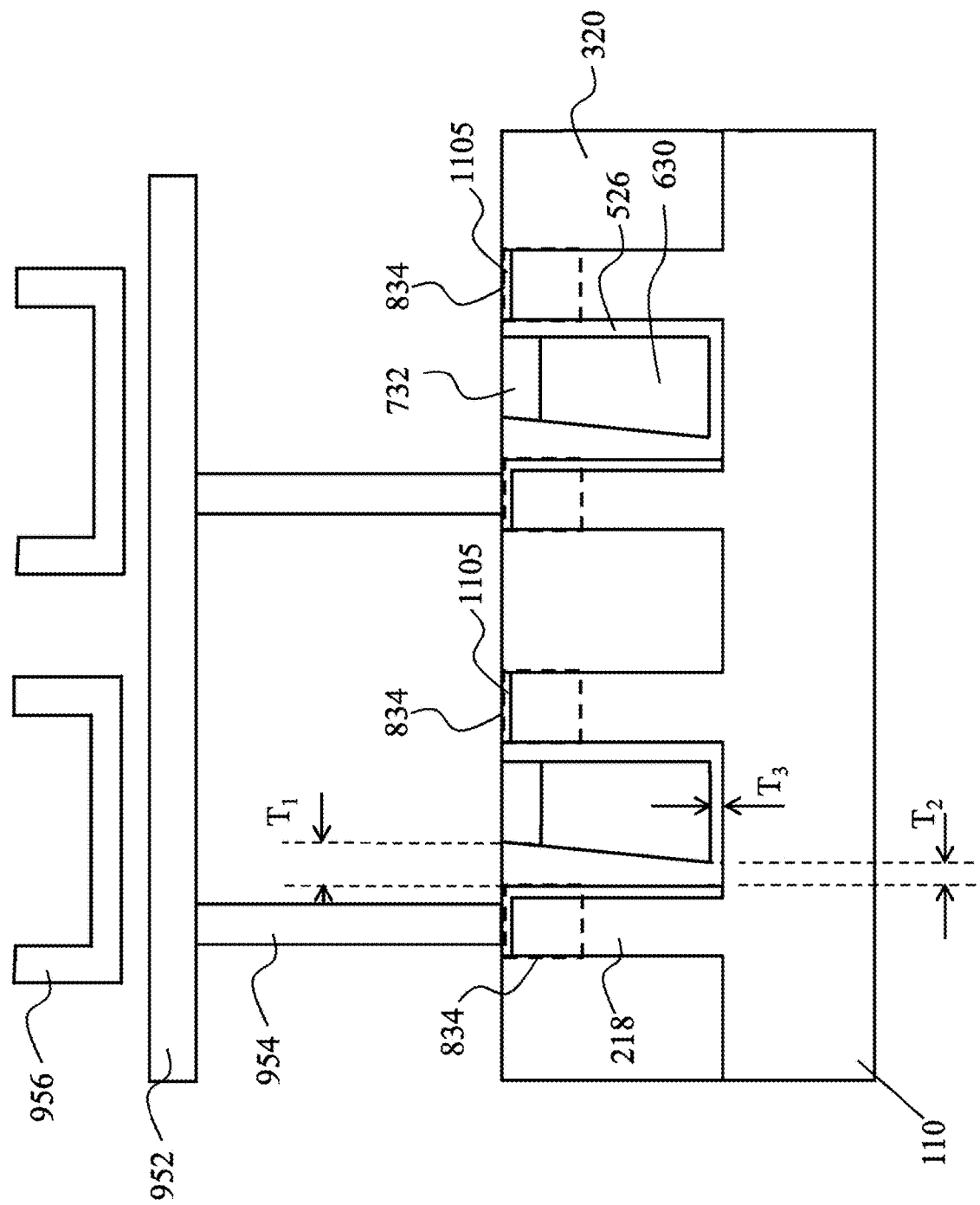

FIG. 14 illustrates that, once the first implantation process 1101 (but not the second implantation process 1103) has been performed, the gate insulator layer 526 may be formed as described above with respect to FIG. 5. For example, the gate insulator layer 526 may be an oxide layer formed by an oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor, although any suitable process and material may alternatively be utilized.

However, with the presence of the dielectric growth modifier within one sidewall of the trench 216, the gate insulator layer 526 will grow at a different rate (e.g., faster) rate along the sidewall of the trench 216 that has been implanted with the dielectric growth modifier and not as fast along the opposing sidewall of the bottom of the trench 216. As such, the gate insulator layer 526 will decrease in thickness along the sidewall from the top of the trench 216 to the bottom of the trench 216. For example, at the top of the trench 216 along the sidewall that was implanted with the dielectric growth modifier, the gate insulator layer 526 may have the first thickness $T_1$, while near the bottom of the trench 216 the gate insulator layer 526 along the sidewall may have the second thickness $T_2$. Additionally, in this embodiment the gate insulator layer 526 along both the bottom of the trench 216 and the other sidewall (the sidewall that was not implanted with the dielectric growth modifier) may have the third thickness $T_3$.

Once the gate insulator layer 526 has been formed, the gate electrodes 630 may be formed over the gate insulator layer 526, the second dielectric layer 732 may be formed over the gate electrodes 630, the source/drain regions 834 may be formed in the fins 218 (represented in FIG. 15 by the dashed lines labeled 834), the optional silicide regions 836 (not separately illustrated in FIG. 14) may be formed, and the bitline contacts 954, the bitline 952, the storage node contacts 958 and the storage node 956 may be formed. In an embodiment the gate electrodes 630, the second dielectric layer 732, the source/drain regions 834, the optional silicide regions 836, the bitline contacts 954 and the storage node 956 may be formed as described above with respect to FIGS. 5-10b. However, any other suitable methods and materials may alternatively be used.

By utilizing the dielectric growth modifier along one of the sidewalls of the trench 216, the formation of the gate can be better controlled such that a thicker dielectric may be formed on one of the source/drain regions 834 (e.g., on the source line node of the embedded transistor) without having a thicker dielectric on the other source/drain region 834 (e.g., bit line node). As such, the benefits of the thicker dielectric on the source line node (e.g. GIDL reduction) may be achieved without deterioration of a drive current that may occur with a thicker dielectric on the bit line node.

In accordance with an embodiment, a method of manufacturing a semiconductor device comprising implanting a dielectric growth modifier into a first sidewall of a trench is provided. A gate insulator layer is formed along the first sidewall and a bottom of the trench, wherein the gate insulator layer forms at a different rate along the first sidewall of the trench than along the bottom of the trench such that the gate insulator layer has a decreasing thickness along the first sidewall of the trench.

In accordance with another embodiment, a method of manufacturing a semiconductor device comprising implanting a first dielectric growth modifier into a first sidewall of a trench at a first angle is provided. A second dielectric growth modifier is implanted into a second sidewall of the trench different from the first sidewall, wherein the implanting the second dielectric growth modifier is performed at a second angle different from the first angle. A gate insulator layer is grown along a bottom of the trench, the first sidewall, and the second sidewall, wherein the gate insulator layer has a first thickness along the bottom of the trench that is less than a second thickness along the first sidewall and the second sidewall.

In accordance with yet another embodiment, a semiconductor device comprising a trench in a substrate, the trench comprising a first sidewall, a second sidewall, and a bottom is provided. A gate insulator layer lines the first sidewall, the second sidewall, and the bottom of the trench, wherein the gate insulator layer lining the first sidewall has a decreasing thickness from a top of the trench to the bottom of the trench.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a plurality of trenches within a semiconductor substrate, each one of the plurality of trenches having a first height;
    depositing one or more dielectric materials filling a first one of the plurality of trenches and a second one of the plurality of trenches adjacent to the first one of the plurality of trenches;
    removing the dielectric material from the first one of the plurality of trenches;
    implanting a dielectric growth modifier into a single sidewall of the first one of the plurality of trenches, wherein the implanting the dielectric growth modifier also implants the dielectric growth modifier along a top surface of the one or more dielectric materials within the second one of the plurality of trenches from a first side of the one or more dielectric materials to a second side of the one or more dielectric materials; and
    forming a gate dielectric along the single sidewall, the gate dielectric having a first thickness that varies along the first sidewall of the first one of the plurality of trenches.

2. The method of claim 1, wherein the first thickness at a top of the first one of the plurality of trenches is between about 30 Å and about 40 Å.

3. The method of claim 2, wherein the first thickness at a bottom of the first one of the plurality of trenches is less than 20 Å.

4. The method of claim 1, wherein the first one of the plurality of trenches is located adjacent to a semiconductor fin, the semiconductor fin having a width of between about 100 Å to about 800 Å.

5. The method of claim 1, wherein the implanting the dielectric growth modifier implants the dielectric growth modifier at an angle that is greater than an arctangent of a width of the second one of the plurality of trenches divided by the first height.

6. The method of claim 1, further comprising:
    a gate electrode over the gate dielectric; and
    a dielectric material over the gate electrode and located within the first one of the plurality of trenches.

7. A method of manufacturing a semiconductor device, the method comprising:
    forming a first trench with a first depth in a semiconductor substrate;
    forming a second trench with the first depth in the semiconductor substrate;
    filling the second trench with one or more dielectric materials;
    implanting a dielectric growth modifier along an entire top surface of the one or more dielectric materials; and
    forming a gate dielectric within the first trench, the gate dielectric having a first portion with a first thickness adjacent to a sidewall of the first trench, a second portion with a first second thickness less than the first thickness, the second portion being adjacent to a bottom surface of the first trench, and a third portion with a third thickness larger than the second thickness, the third portion being adjacent to a second sidewall of the first trench.

8. The method of claim 7, wherein the implanting the dielectric growth modifier implants the dielectric growth modifier within the first sidewall to a concentration of between about 1E13 $cm^2$ and about 1E15 $cm^2$.

9. The method of claim 7, wherein the first thickness is between about 30 Å and about 40 Å.

10. The method of claim 7, wherein the second thickness is less than 20 Å.

11. The method of claim 7, wherein the implanting the dielectric growth modifier implants fluorine.

12. The method of claim 7, wherein the first trench is fully filled with the gate dielectric, a gate electrode and a dielectric material over the gate electrode.

13. The method of claim 7, wherein the bottom surface of the first trench is primarily free from the dielectric growth modifier.

14. The method of claim 13, wherein the second thickness is less than about 20 Å.

15. A method of manufacturing a semiconductor device, the method comprising:
    forming a first trench in a substrate, the first trench comprising a first sidewall, a second sidewall, and a bottom;
    forming an isolation region in the substrate, wherein the isolation region and the first trench extend into the substrate a first distance;
    implanting a dielectric growth modifier zone located adjacent to the trench and extending along a top surface from a first side of the isolation region to a second side of the isolation region opposite the first side of the isolation region; and
    forming a gate insulator layer lining the first sidewall, the second sidewall, and the bottom of the first trench, wherein the gate insulator layer lining the first sidewall has a decreasing thickness from a top of the first trench to the bottom of the trench.

16. The method of claim 15, further comprising forming a gate electrode adjacent to the gate insulator layer.

17. The method of claim 16, further comprising forming a dielectric material located within the first trench, the gate electrode being located between the dielectric material and at least a portion of the gate insulator layer.

18. The method of claim 15, wherein the dielectric growth modifier zone has a first concentration of a dielectric growth enhancing material located within the first sidewall, the first concentration being between about 1E13 $cm^2$ and about 1E15 $cm^2$.

19. The method of claim 15, wherein after the implanting the dielectric growth modifier zone the bottom of the first trench is primarily free from the dielectric growth enhancing material.

20. The method of claim 15, wherein the implanting the dielectric growth modifier zone implants fluorine.

* * * * *